(12) United States Patent
Furukawa

(10) Patent No.: US 7,023,233 B1
(45) Date of Patent: Apr. 4, 2006

(54) TEST APPARATUS AND TEST METHOD

(75) Inventor: Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/992,988

(22) Filed: Nov. 19, 2004

(30) Foreign Application Priority Data

Oct. 12, 2004 (JP) .............................. 2004-298259

(51) Int. Cl.
  *G01R 31/26* (2006.01)
(52) U.S. Cl. .................................... 324/769; 324/158.1
(58) Field of Classification Search ................ 324/763, 324/765, 769, 158.1; 368/110, 118, 120; 714/718, 721, 725
See application file for complete search history.

(56) References Cited

U.S. PATENT DOCUMENTS 4,712,058 A * 12/1987 Branson et al. ............. 324/763
5,157,627 A * 10/1992 Gheewala .............. 365/189.01
5,942,922 A *  8/1999 Dinteman et al. .......... 327/108

OTHER PUBLICATIONS

Hurst, et al.; "Flip-Flop Sharing in Standard Scan Path to Enhance Delay Fault Testing of Sequential Circuits"; Center for Digital Systems Engineering. Research Triangle Institute; 1995 IEEE; pp. 346-352.
Hatayama, et al.; "Application of a Design for Delay Testability Approach to High Speed Logic LSIs"; Hitachi Information Technology Co., Ltd.; 1997 IEEE; pp. 112-115.
Touba, et al.; "Applying Two-Pattern Tests Using Scan-Mapping"; Center for Reliable Computing, Stanford University; 1996 IEEE; pp. 393-397.

(Continued)

*Primary Examiner*—Vinh Nguyen
*Assistant Examiner*—Tung X. Nguyen
(74) *Attorney, Agent, or Firm*—Osha Liang LLP

(57) ABSTRACT

A test apparatus for testing switching speed of a circuit, which includes a pre-stage logic element outputting a first or second level voltage and a post-stage logic element to which the output signal of the pre-stage logic element is input, is provided, wherein the post-stage logic element includes the post-stage FET, a gate terminal of which the output signal is input to, for outputting a different level of voltage according to the case that the output signal voltage is higher or lower than a predetermined threshold voltage, and the test apparatus includes a threshold voltage setting unit for setting a threshold voltage of a post-stage field effect transistor (FET) to be different from that in a normal operation by setting a substrate voltage of the post-stage FET to have a value different from that in the normal operation of the circuit; a delay time measuring unit for measuring a delay time of the circuit to which the threshold voltage different from that in the normal operation is set; and an error detecting unit for detecting an error in switching speed of the circuit based on the delay time.

6 Claims, 8 Drawing Sheets

OTHER PUBLICATIONS

MacDonald, et al.; "Delay Testing of SOI Circuits: Challenges with the History Effect"; ITC International Test Conference; 1999 IEEE; pp. 269-275.

Mizuno; "Leakage Current and Its Suppression Technique in Low-Voltage High-Speed CMOS LSIs"; vol. J83-C, No. 10, Oct. 2000; pp. 926-935.

* cited by examiner

TEST APPARATUS AND TEST METHOD

This patent application claims priority from a Japanese patent application No. 2004-298259 filed on Oct. 12, 2004, the contents of which are incorporated herein by reference.

BACKGROUND OF THE INVENTION

1. Field of the Invention

The present invention relates to a test apparatus and a test method. More particularly, the present invention relates to a test apparatus and a test method for detecting a delay failure of a circuit.

2. Description of the Related Art

In connection with miniaturization of LSI in recent years, miniaturization of logical elements in the LSI is progressing. Accordingly, driving performance of the logic element decreases, and thus a delay failure of the logic element becomes a major cause for a failure of the LSI.

The following documents relate to a scan test for detecting this kind of delay failure and discloses a scan method which switches a test pattern of a cycle to a test pattern of its next cycle at a high speed (cf. J. P. Hurst, N. Kanopoulos, "Flip-Flop Sharing in Standard Scan Path to Enhance Delay Fault Testing of Sequential Circuits," Asian Test Symposium 1995, IEEE, Nov. 23, 1995, p. 346–352; K. Hatayama, M. Ikeda, M. Takakura, S. Uchiyama, Y. Sakamoto, "Application of a Design for Delay Testability Approach to High Speed Logic LSIs," Asian Test Symposium 1997, IEEE, Nov. 17, 1997, p. 112–115; N. A. Touba, E. J. McCluskey, "Applying Two-Pattern Tests Using Scan-Mapping," IEEE VLSI Test Symposium 1996, IEEE, Apr. 28, 1996, p. 393–397; Eric MacDonald, N. A. Touba, "Delay Testing of SOI Circuits: Challenges with the History Effect," International Test Conference 1999, IEEE, Sep. 27, 1999, p. 269–275. According to the documents, it is possible to detect whether or not a circuit operates within a predetermined delay time by controlling clock intervals of adjacent clocks (double clocks) and testing whether or not the circuit correctly operates.

According to the above tests using the double clocks, the absolute value of a delay time of a circuit is measured and acceptability of an LSI is determined based on the measured absolute value. Therefore, it is impossible to determine whether the measured delay is caused by the variance of a process or by a delay failure of a logic element.

Therefore, it is an object of the present invention to provide a test apparatus and a test method, which are capable of overcoming the above drawbacks. The above and other objects can be achieved by combinations described in the independent claims. The dependent claims define further advantageous and exemplary combinations of the present invention.

SUMMARY OF THE INVENTION

According to the first aspect of the present invention, there is provided a test apparatus for testing switching speed of a circuit, which includes a pre-stage logic element outputting a first or second level voltage and a post-stage logic element to which the output signal of the pre-stage logic element is input, is provided, wherein the post-stage logic element includes the post-stage FET, a gate terminal of which the output signal is input to, for outputting a different level of voltage according to the case that the output signal voltage is higher or lower than a predetermined threshold voltage. The test apparatus includes a threshold voltage setting unit for setting a threshold voltage of a post-stage field effect transistor (FET) to be different from that in a normal operation by setting a substrate voltage of the post-stage FET to have a value different from that in the normal operation of the circuit; a delay time measuring unit for measuring a delay time of the circuit to which the threshold voltage different from that in the normal operation is set; and an error detecting unit for detecting an error in switching speed of the circuit based on the delay time.

The threshold voltage setting unit may include a first substrate voltage setting unit for setting the threshold voltage to the post-stage FET by setting the substrate voltage to a first substrate voltage; and a second substrate voltage setting unit for setting the threshold voltage to the post-stage FET by setting the substrate voltage to a second substrate voltage. The delay time measuring unit may include a first delay time measuring unit for measuring a first delay time of the circuit when the substrate voltage is set to the first substrate voltage; and a second delay time measuring unit for measuring a second delay time of the circuit when the substrate voltage is set to the second substrate voltage. The error detecting unit detects the error in switching speed of the circuit in case of the difference between the first and the second delay times being larger than a predetermined reference value.

The first substrate voltage setting unit may set the substrate voltage to the first substrate voltage used in the normal operation of the circuit.

The pre-stage logic element may include a pre-stage P-channel FET including a source terminal coupled to a voltage source with respect to the output signal and a drain terminal coupled to the side of the output signal with respect to the source terminal; and a pre-stage N-channel FET including a source terminal coupled to a ground with respect to the output signal and a drain terminal coupled to the side of the output signal with respect to the source terminal. The post-stage logic element may include a post-stage P-channel FET including a source terminal coupled to a voltage source with respect to the output of the post-stage logic element and a drain terminal coupled to the output side with respect to the source terminal; and a pre-stage N-channel FET including a source terminal coupled to a ground with respect to the output and a drain terminal coupled to the output side with respect to the source terminal. The first substrate voltage setting unit may set the substrate voltage of the post-stage N-channel FET to the first substrate voltage. The first delay time measuring unit measures the first delay time when the substrate voltage of the post-stage N-channel FET is set to the first substrate voltage. The second substrate voltage setting unit may set the substrate voltage of the post-stage N-channel FET to the second substrate voltage. The second delay time measuring unit may measure the second delay time when the substrate voltage is set to the second substrate voltage. The error detecting unit may detect an error in the pre-stage P-channel FET in case of the difference between the first and second delay times being larger than the reference value.

The pre-stage logic element may include a pre-stage P-channel FET including a source terminal coupled to a voltage source with respect to the output signal and a drain terminal coupled to the side of the output signal with respect to the source terminal; and a pre-stage N-channel FET including a source terminal coupled to a ground with respect to the output signal and a drain terminal coupled to the side of the output signal with respect to the source terminal. The post-stage logic element may includes a post-stage P-channel FET including a source terminal coupled to a voltage source with respect to the output of the post-stage logic element and a drain terminal coupled to the output side with respect to the source terminal; and a pre-stage N-channel FET including a source terminal coupled to a ground with respect to the output and a drain terminal coupled to the output side with respect to the source terminal. The first substrate voltage setting unit may set the substrate voltage of the post-stage P-channel FET to the first substrate voltage. The first delay time measuring unit may measure the first delay time when the substrate voltage of the post-stage P-channel FET is set to the first substrate voltage. The second substrate voltage setting unit may set the substrate voltage of the post-stage P-channel FET to the second substrate voltage. The second delay time measuring unit measures the second delay time when the substrate voltage is set to the second substrate voltage. The error detecting unit may detect an error in the pre-stage N-channel FET in case of the difference between the first and second delay times being larger than the reference value.

According to the second aspect of the present invention, there is provided a test apparatus for testing switching speed of a combination circuit, where a level voltage based on a signal input from a first flip-flop (FF) is input to a second FF, including a pre-stage logic element outputting a first or second level voltage and a post-stage logic element to which the output signal of the pre-stage logic element is input, is provided, wherein the test apparatus includes a clock setting unit for setting a clock interval from the time when a clock signal is provided to the first FF to the time when a clock signal is provided to the second FF; a threshold voltage setting unit for setting a threshold voltage of a post-stage field effect transistor (FET) to be different from that in a normal operation by setting a substrate voltage of the post-stage FET to have a value different from that in the normal operation of the circuit; a first boundary value measuring unit for measuring a first boundary value of the substrate voltage for a normal operation of the circuit by changing the substrate voltage by the threshold voltage setting unit while the clock interval is set to the first clock interval; and an error detecting unit for detecting an error in switching speed of the circuit based on the first boundary value, wherein the post-stage logic element includes the post-stage FET, a gate terminal of which the output signal is input to, for outputting a different level of voltage according to the case that the output signal voltage is higher or lower than a predetermined threshold voltage.

The test apparatus may further include a second boundary value measuring unit for measuring a second boundary value of the substrate voltage for a normal operation of the circuit by changing the substrate voltage by the threshold voltage setting unit with the clock interval set to the second clock interval, wherein the error detecting unit may detect an error in switching speed of the circuit based on the first and second boundary values.

According to the third aspect of the present invention, there is provided a test method for testing switching speed of a circuit, which includes a pre-stage logic element outputting a first or second level voltage and a post-stage logic element to which the output signal of the pre-stage logic element is input, includes a threshold voltage setting step of setting a threshold voltage of a post-stage field effect transistor (FET) to be different from that in a normal operation by setting a substrate voltage of the post-stage FET to have a value different from that in the normal operation of the circuit; a delay time measuring step of measuring a delay time of the circuit to which the threshold voltage different from that in the normal operation is set; and an error detecting step of detecting an error in switching speed of the circuit based on the delay time, wherein the post-stage logic element includes the post-stage FET, a gate terminal of which the output signal is input to, for outputting a different level of voltage according to the case that the output signal voltage is higher or lower than a predetermined threshold voltage.

According to the fourth aspect of the present invention, there is provided a test method for testing switching speed of a combination circuit, where a level voltage based on a signal input from a first flip-flop (FF) is input to a second FF, including a pre-stage logic element outputting a first or second level voltage and a post-stage logic element to which the output signal of the pre-stage logic element is input, wherein the post-stage logic element includes a post-stage field effect transistor (FET), the output signal being in put to a gate terminal of the post-stage FET, for outputting a different level of voltage according to the case that the output signal voltage is higher or lower than a predetermined threshold voltage, the test method includes: a clock setting step of setting a clock interval from the time when a clock signal is provided to the first FF to the time when a clock signal is provided to the second FF; a threshold voltage setting step of setting a threshold voltage of the post-stage FET to be different from that in a normal operation by setting a substrate voltage of the post-stage FET to have a value different from that in the normal operation of the circuit; a first boundary value measuring step of measuring a first boundary value of the substrate voltage for a normal operation of the circuit by changing the substrate voltage in the threshold voltage setting step while the clock interval is set to the first clock interval; and an error detecting step of detecting an error in switching speed of the circuit based on the first boundary value.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
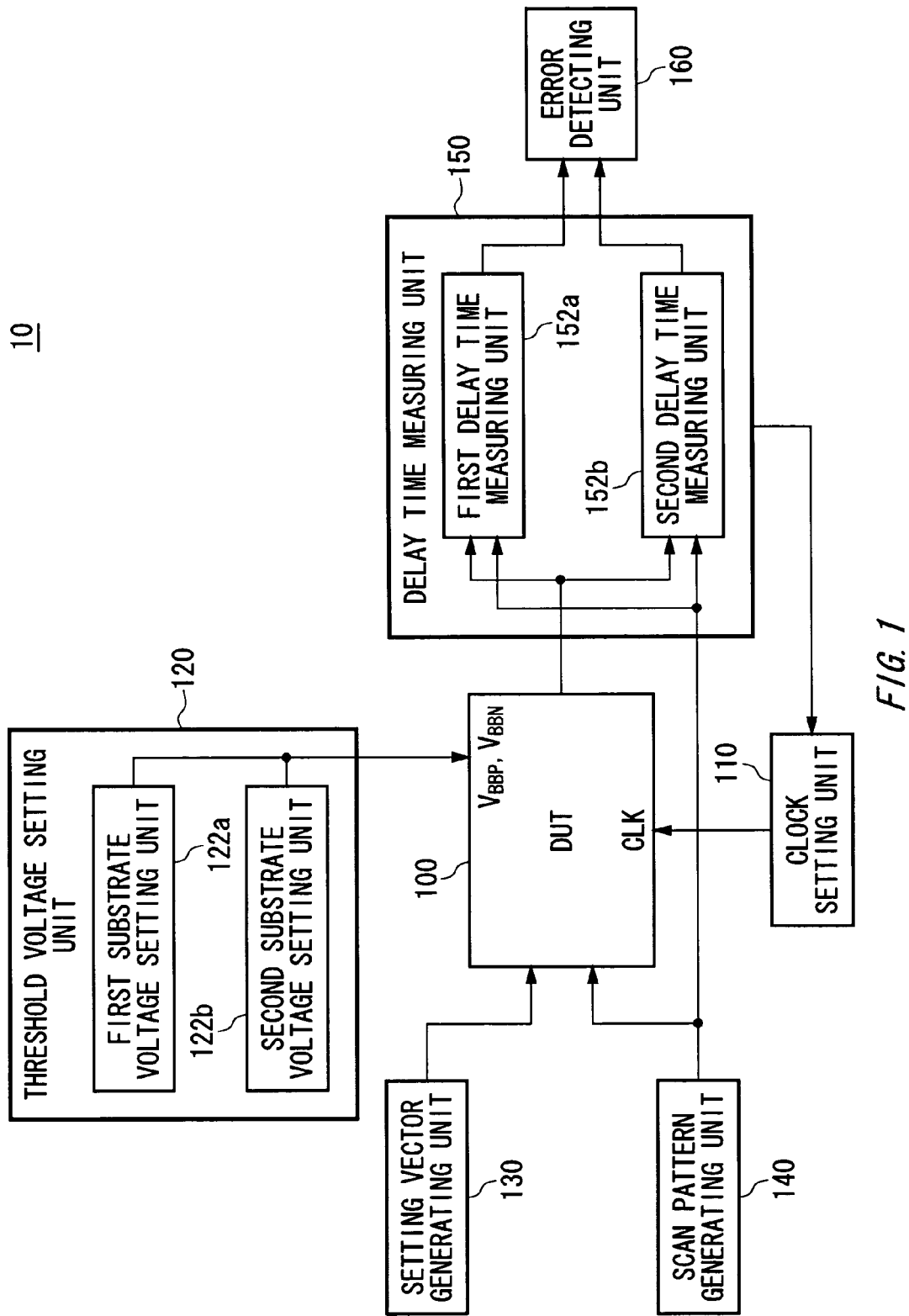
FIG. 1 shows an example of the configuration of a test apparatus 10 according to an embodiment of the present invention.

FIG. 1 shows an example of the configuration of a test apparatus 10 and a DUT 100 according to an embodiment of the present invention. The test apparatus 10 detects an error by testing switching speed of a circuit of the DUT 100. The test apparatus 10 includes a clock setting unit 110, a threshold voltage setting unit 120, a setting vector generating unit 130, a scan pattern generating unit 140, a delay time measuring unit 150, and an error detecting unit 160.

The clock setting unit 110 sets a clock interval provided to the circuit of the DUT 100. The threshold voltage setting unit 120 sets a threshold of a FET (Field Effect Transistor) provided in a logic element in the DUT 10 by setting a substrate voltage of the FET. The threshold voltage setting unit 120 includes a first substrate voltage setting unit 122a for setting a first threshold voltage of the FET by setting the substrate voltage of the FET in the DUT to a first substrate voltage and a second substrate voltage setting unit 122b for setting a second threshold voltage of the FET by setting the substrate voltage to a second substrate voltage. The first substrate voltage setting unit 122a according to the present embodiment sets the substrate voltage of the FET to the first substrate voltage in a normal operation of the circuit. The second substrate voltage setting unit 122b sets the FET to have a threshold voltage of which value is different from that of the normal operation by setting the substrate voltage of the FET to a value different from the value of the substrate voltage in the normal operation of the circuit. Instead, the first and the second substrate voltages may be different from the voltage in the normal operation of the circuit.

The setting vector generating unit 130 generates a setting vector which is a test pattern used to test a path to be tested out of paths in the DUT and provides a signal terminal with the setting vector. Thus, the setting vector generating unit 130 sets the DUT to be in a state capable of testing the path to be tested. The scan pattern generating unit 140 generates a scan pattern used for a test of a delay failure and provides a scan terminal of the DUT 100 with the scan pattern.

The delay time measuring unit 150 measures a delay time of the circuit of the DUT 100 in case of being provided with the first substrate voltage and a delay time of the circuit of the DUT 100 in case of being provided with the second substrate voltage. The delay time measuring unit 150 includes a first delay time measuring unit 152a for measuring a delay time of the circuit in a state of the substrate voltage's being set to the first substrate voltage (a first delay time) and a second delay time measuring unit 152b for measuring a delay time of the circuit in a state of the substrate voltage's being set to the second substrate voltage (a second delay time). The first delay time measuring unit 152a according to the present embodiment measures a delay time of the circuit set to the first threshold voltage, which is substantially the same as that in the normal operation, in a state of the FET's being provided with the first substrate voltage. The second delay time measuring unit 152b measures a delay time of the circuit set to a threshold different from that of the normal operation.

The error detecting unit 160 detects an error in switching speed of the circuit of the DUT 100 based on the delay time measured by the delay time measuring unit 150. The error detecting unit 160 according to the present embodiment detects an error in the switching speed of the circuit in case of the difference between the first delay time and the second delay time being larger than a predetermined reference value.

Figure 2:
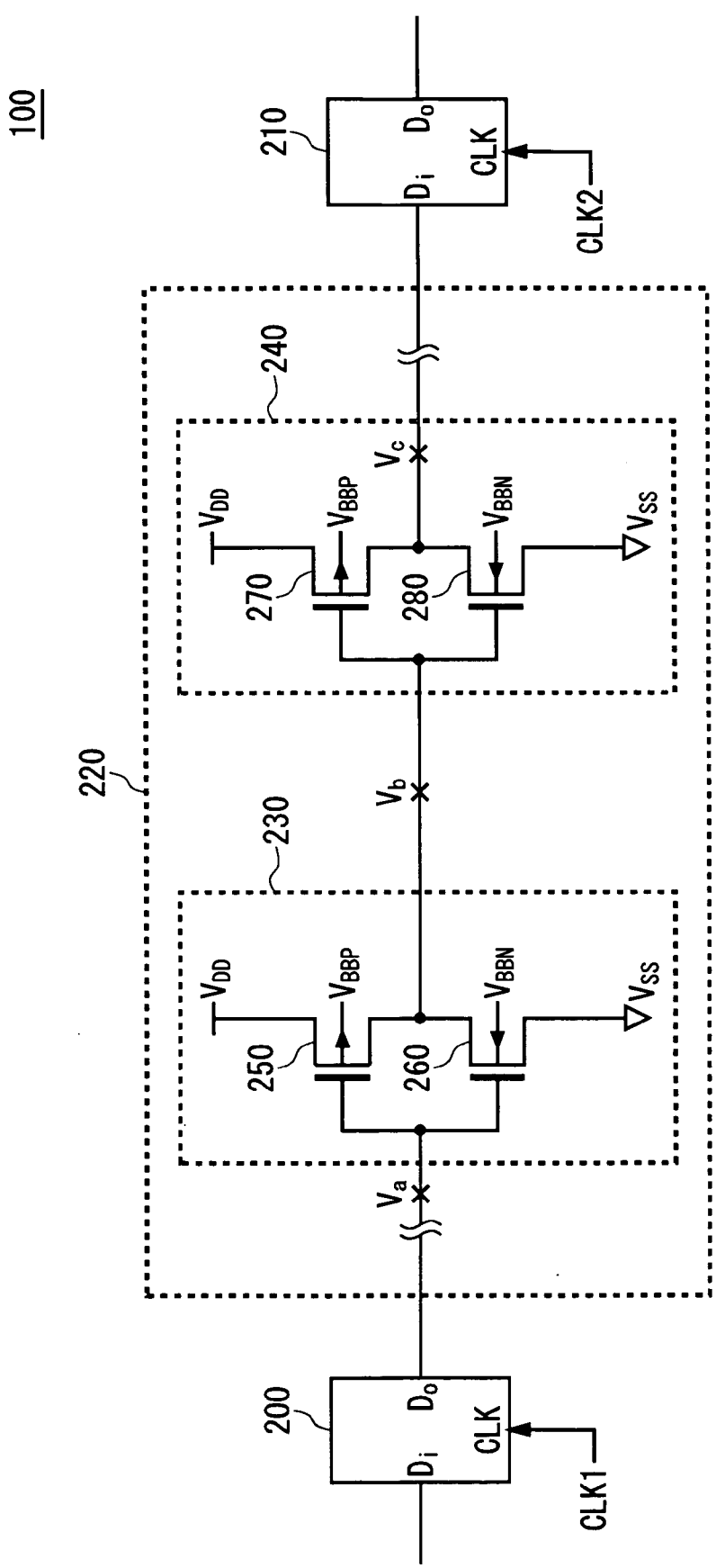
FIG. 2 shows an example of the configuration of a DUT 100 according to the embodiment of the present invention.

FIG. 2 shows an example of the configuration of the DUT 100 according to the present embodiment. The DUT 100 includes a plurality of flip-flops (FF200, FF210, etc.) and a plurality of combination circuits provided between a pre-stage FET and a post-stage FET. According to the present embodiment, a test of a logic path including FF200, FF210, and a circuit 220 provided between the FF 200 and the FF 210 will be explained as a representative of a plurality of logic paths in the DUT 100.

The FF 200 is an example of a first FF according to the present invention, receives a level voltage of an input Di at a rising timing of a clock signal CLK1, and outputs it as an output Do. The FF210 is an example of a second FF according to the present invention, receives a level voltage of an input Di at a rising timing of a clock signal CLK2, and outputs it as an output Do.

The circuit 220 is a combination circuit which inputs the level voltage based on the signal Do input from the FF 200 to an input terminal Di of the FF 210. More specifically, the circuit 220 performs a predetermined logic operation based on the signal input from the FF200 and inputs a level voltage showing a logic value resulting from the logic operation to the FF 210.

The circuit 220 has a structure in which the logic elements such as AND, NAND, OR, NOR, EXOR, and NOT are cascade-connected. According to the example of the present figure, the circuit 220 includes a pre-stage logic element 230 for outputting a first level voltage (for example, a voltage showing a logic value H) or a second level voltage (for example, a voltage showing a logic value L) onto a logic path from the FF 200 to the FF 210 and a post-stage logic element 240 coupled to the rear part of the pre-stage logic element 230 to which the output signal of the pre-stage logic element 230 is input.

The pre-stage logic element 230 includes a pre-stage P-channel FET 250 and a pre-stage N-channel FET 260. The pre-stage P-channel FET 250 is a MOSFET of which source is coupled to a voltage source side with respect to the output signal, and drain is coupled to an output signal side with respect to the source. The pre-stage N-channel FET 260 is a MOSFET of which source is coupled to a ground side with respect to the output signal, and drain is coupled to an output signal side with respect to the source. The pre-stage logic element 230 according to the present embodiment functions as an inverter. The pre-stage logic element 230 may further include one or a plurality of P-channel FET(s) coupled between the pre-stage P-channel FET 250 and the voltage source or between the pre-stage P-channel FET 250 and the output signal in series. In addition, the pre-stage logic element 230 may further include one or a plurality of N-channel FET(s) coupled between the pre-stage N-channel FET 260 and the ground or between the pre-stage N-channel FET 260 and the output signal in series. In this case, the pre-stage logic element 230 functions as a logic element such as AND, NAND, NOR, OR, or EXOR.

The post-stage logic element 240 includes a post-stage P-channel FET 270 and a post-stage P-channel FET 280 for inputting the output signal of the pre-stage logic element 230 to a gate terminal and outputting a different level of voltage in case of the output signal voltage being higher and lower than a threshold voltage. Since the post-stage logic element 240 has a configuration similar to that of the pre-stage logic element 230, the pre-stage P-channel FET 250 corresponds to the post-stage P-channel FET 270, and the pre-stage N-channel FET 260 corresponds to the post-stage N-channel FET 280, explanation on the same parts is omitted.

Figure 3:
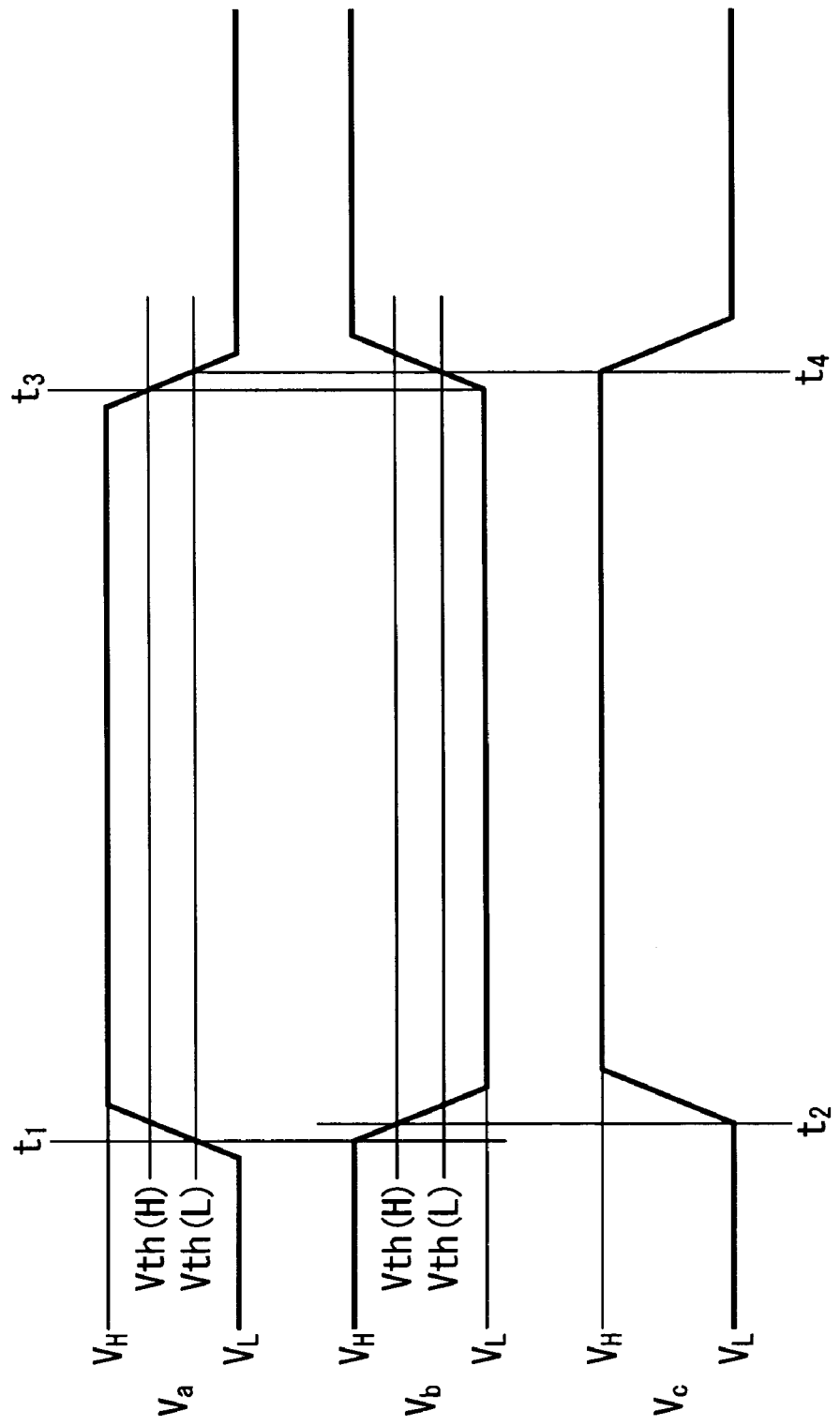
FIG. 3 shows a normal operation of the DUT 100 according to the embodiment of the present invention.

FIG. 3 shows a normal operation of the DUT 100 according to the present embodiment. In case of a voltage Va input to the pre-stage logic element 230 being a voltage VL showing a level L, the pre-stage P-channel FET 250 becomes ON and the pre-stage N-channel FET 260 becomes OFF. Therefore, a voltage Vb of the output signal of the pre-stage logic element 230 becomes a voltage VH showing a level H. Further, the post-stage P-channel FET 270 becomes OFF, the post-stage N-channel FET 280 becomes ON, and a voltage Vc output from the post-stage logic element 240 becomes the voltage VL.

Then, in case of the voltage Va being changed from VL to VH, if the voltage Va is higher than a threshold voltage Vth (L) of the pre-stage N-channel FET 260, the pre-stage N-channel FET 260 is switched from OFF to ON (time t1). As a result, the voltage Vb of the output signal of the pre-stage logic element 230 begins to change from VH to VL. Then, if the voltage Va is higher than a threshold voltage Vth (H) of the pre-stage P-channel FET 250, the pre-stage P-channel FET 250 is switched from ON to OFF and the voltage Vb of the output signal becomes VL.

Then, if the voltage Vb becomes lower than a threshold voltage Vth (H) of the post-stage P-channel FET 270, the post-stage P-channel FET 270 is switched from OFF to ON (time t2). As a result, the voltage Vc of the output signal of the post-stage logic element 240 begins to change from VH to VL. Then, if the voltage Vb is lower than a threshold voltage Vth (L) of the post-stage N-channel FET 280, the post-stage N-channel FET 280 is switched from ON to OFF and the voltage Vc becomes VH.

According to the above operations, in case of the voltage Va being the voltage VH, the pre-stage P-channel FET 250 becomes OFF, the pre-stage N-channel FET 260 becomes ON, the post-stage P-channel FET 270 becomes ON, and the post-stage N-channel FET 270 becomes OFF.

In the mean time, in case of the voltage Va being changed from VH to VL, if the voltage Va is lower than the threshold voltage Vth (H) of the pre-stage P-channel FET 250, the pre-stage P-channel FET 250 is switched from OFF to ON (time t3). As a result, the voltage Vb of the output signal of the pre-stage logic element 230 begins to change from VL to VH. Then, if the voltage Va is lower than the threshold voltage Vth (L) of the pre-stage N-channel FET 260, the pre-stage N-channel FET 260 is switched from ON to OFF and the voltage Vb of the output signal becomes VH.

Then, if the voltage Vb becomes higher than a threshold voltage Vth (L) of the post-stage N-channel FET 280, the post-stage N-channel FET 280 is switched from OFF to ON (time t4). As a result, the voltage Vc of the output signal of the post-stage logic element 240 begins to change from VH to VL. Then, if the voltage Vb is higher than the threshold voltage Vth (H) of the post-stage P-channel FET 270, the post-stage P-channel FET 270 is switched from ON to OFF and the voltage Vc becomes VL.

Figure 4:
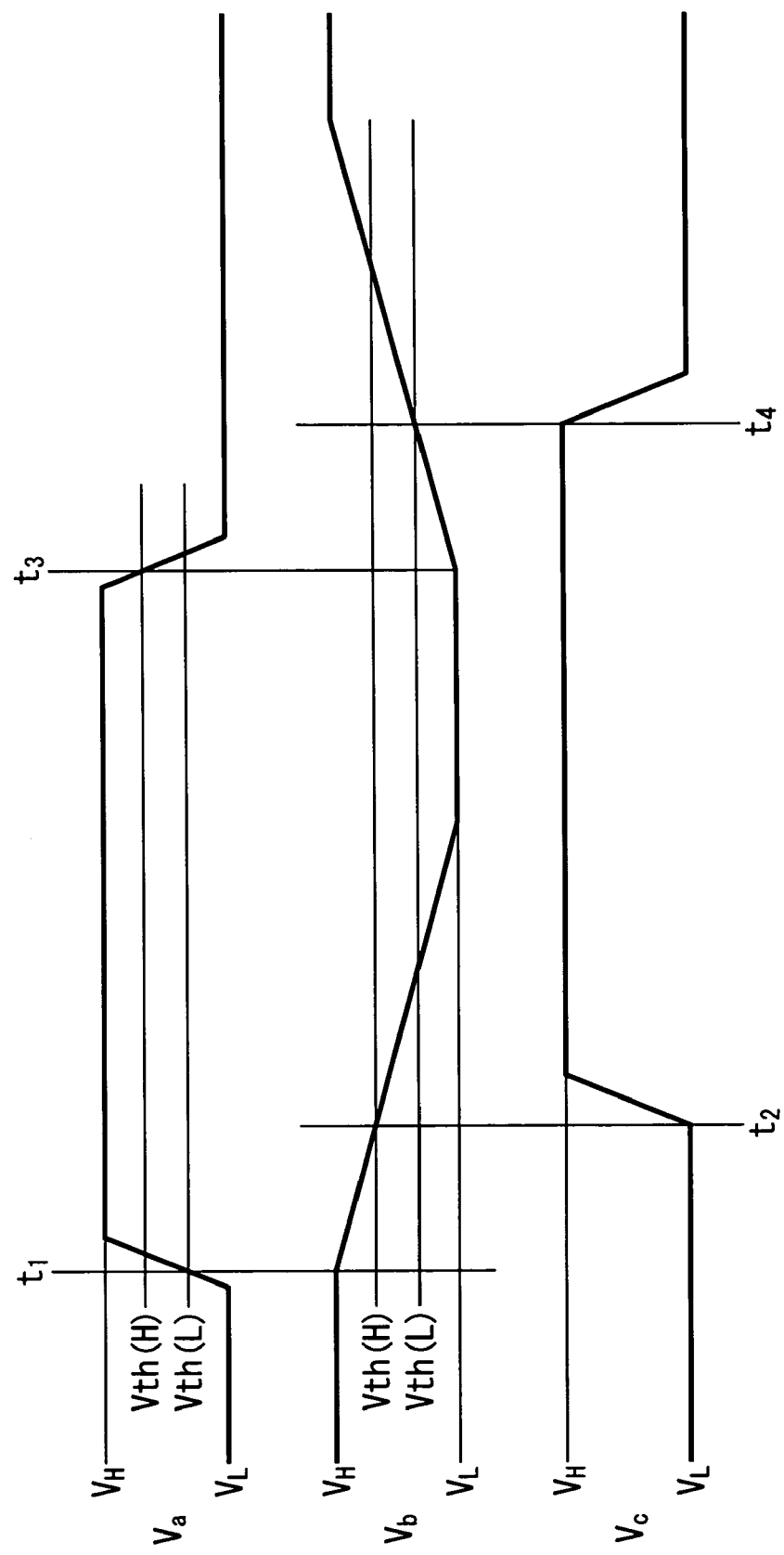
FIG. 4 shows an abnormal operation of the DUT 100 according to the embodiment of the present invention.

FIG. 4 shows an abnormal operation of the DUT 100 according to the present embodiment. In a case where there is a delay failure in the pre-stage N-channel FET 260 of the pre-stage logic element 230, the fall of the voltage Vb becomes slow even if the pre-stage N-channel FET 260 is switched to ON at the time t1. As a result, the time from t1 to t2 at which the voltage Vb becomes lower than the threshold voltage Vth (H) of the post-stage P-channel FET 270 becomes longer than that in a normal state. Since the voltage Vc begins to change from VL to VH at the time t2, a delay time of the circuit 220 becomes longer as a result of the time (t2–t1) becomes larger caused by the delay failure.

In a case where there is a delay failure in the pre-stage P-channel FET 250 of the pre-stage logic element 230, the rising of the voltage Vb becomes slow even if the pre-stage P-channel FET 250 is switched to ON at the time t3. As a result, the time from t3 to t4 at which the voltage Vb becomes higher than the threshold voltage Vth (L) of the post-stage N-channel FET 280 becomes longer than that in a normal state. Since the voltage Vc begins to change from VH to VL at the time t4, the delay time of the circuit 220 becomes longer as a result of the time (t4–t3) becomes larger caused by the delay failure.

Figure 5:
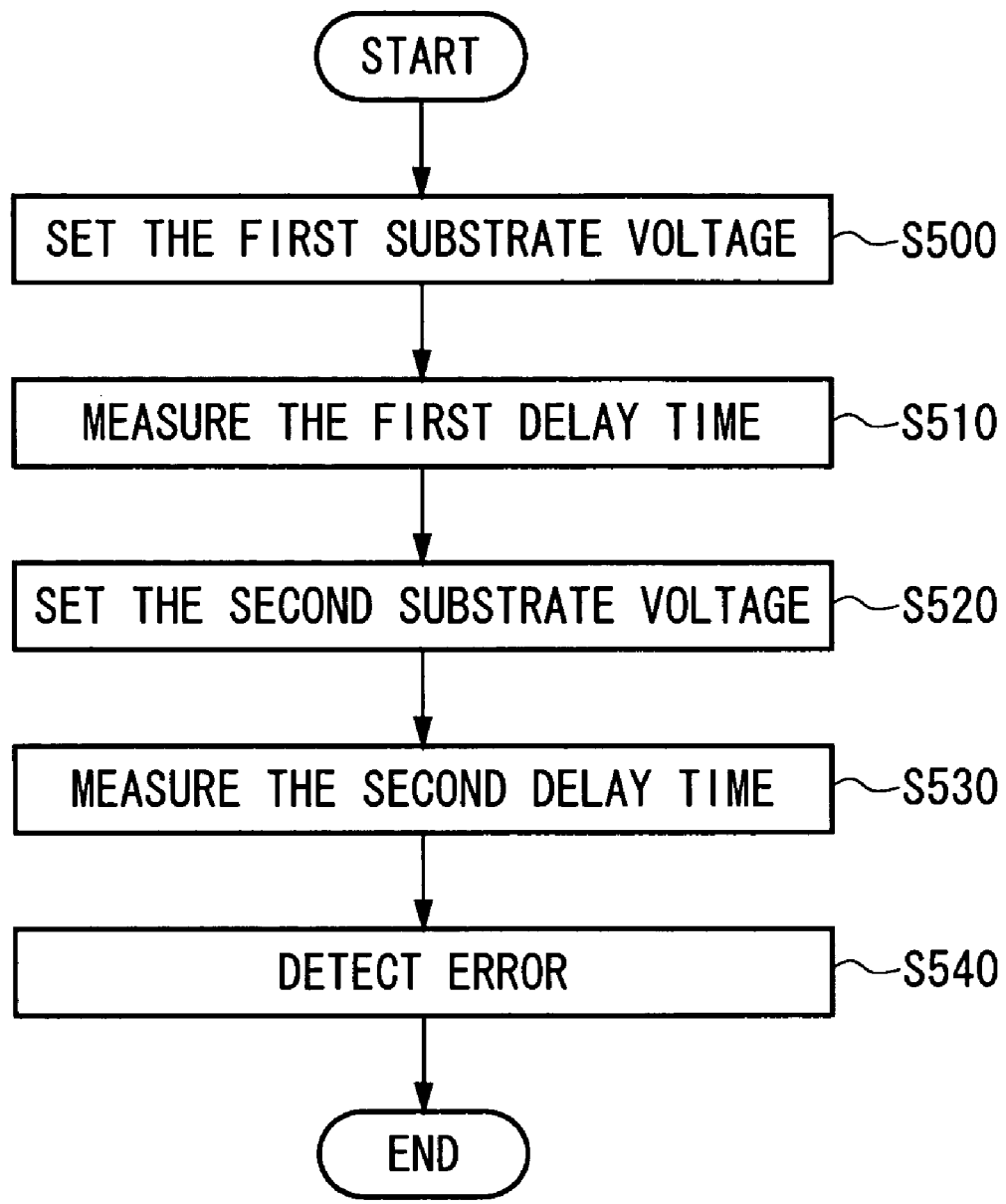
FIG. 5 shows a flow of an operation of the DUT 100 according to the embodiment of the present invention.

FIG. 5 shows a flow of an operation of the DUT 100 according to the present embodiment.

In case of detecting a delay failure of the pre-stage N-channel FET 260, the first substrate voltage setting unit 122a sets the P-channel side substrate voltage VBBp provided to the DUT 100 to the substrate voltage VBBp1 of the side of a first P-channel (S500). Thus, the threshold voltage of each of the pre-stage P-channel type 250 and the post-stage P-channel FET 270 is set to a voltage Vth1 (H).

Then, the first delay time measuring unit 152a measures a first P-channel side delay time Tp1 when the substrate voltage of the post-stage P-channel FET 270 is set to the first substrate voltage VBBp1 (S510). A method for measuring the delay time Tp1 is described in the following, for example. The clock setting unit 110 sets a clock interval from the time when a clock signal is provided to the FF 200 to the time when a clock signal is provided to the FF 210 based on an instruction of the first delay time measuring unit 152a. The setting vector generating unit 130 generates a setting vector for testing the logic path including the FF 200, the circuit 220, and the FF 210 and provides a signal terminal of the DUT 100 with it. Then, the scan pattern generating unit 140 generates a scan pattern used for a test for a delay failure of the logic path, and provides a scan terminal of the DUT 100 with it to make the DUT 100 operate. The first delay time measuring unit 152a acquires a result of the operation of the DUT 100 from the DUT 100 and compares the result with an expectation value generated by the scan pattern generating unit 140. In case of the result of the operation of the DUT 100 being the same as the expectation value, the clock interval is reduced and then the above steps are repeated. According to the above process, the test apparatus 10 can acquire a minimum clock interval at which the logic path in the DUT 100 operates properly and use it as the delay time Tp1.

Then the second substrate voltage setting unit 122b sets the P-channel side substrate voltage VBBp to the second P-channel side substrate voltage VBBp2 (S520). Thus, the threshold voltage of each of the pre-stage P-channel FET 250 and the post-stage P-channel FET 270 is set to a voltage Vth2 (H). Here, the threshold voltage depends on the substrate voltage as disclosed in Hiroyuki Mizuno, "Increase of Leak Current Accompanying Low voltage and High-Speed of CMOS LSI and a Technique for Reducing the Leak Current," Collection of Learned Papers of Electronic Information Communication Society, Electronic Information Communication Society, Vol. J83-C, No. 10, October of 2000, p. 926–935). Therefore, the test apparatus 10 can set the post-stage P-channel FET 270 to a second threshold voltage Vth2 (H) different from the first threshold voltage Vth1 (H) by setting the second substrate voltage VBBp2 different from the first substrate voltage VBBp1.

Then, in a similar way to S510, the second delay time measuring unit 152b measures a second P-channel side delay time Tp2 when the substrate voltage of the post-stage P-channel FET 270 is set to the second substrate voltage VBBp2 (S530).

The error detecting unit 160 detects an error in the switching speed of the circuit 220 caused by a defect of the pre-stage N-channel FET 260 based on the first and second delay times Tp1 and Tp2 (S540). More specifically, letting the absolute value of the difference between the substrate voltages VBBp1 and VBBp2 be ΔVBB, the absolute value of the difference between the delay times Tp1 and Tp2 be ΔTd, and a=ΔTd/ΔVBB. In this case, the index a shows a variation in the delay time with respect to the variation of the substrate voltage. Further, the index a is larger In a case where there is a delay failure in one N-channel side FET or there are delay failures in a plurality of N-channel side FET's provided on the logic path, than that in a normal state.

Here, in case of testing the DUT 100 with the constant ΔVBB, the error detecting unit 160 can detect an error in the pre-stage N-channel FET 260 if ΔTd which is the difference between the first delay time Tp1 and the second delay time Tp2 is larger than a predetermined reference value. In other words, the test apparatus 10 can acquire ΔTd which is an increase in the delay time caused by a delay failure of the pre-stage logic element 230 by the above process and find out a delay failure of the switching by the N-channel FET based on ΔTd. Further, it is preferable that the reference value is set so that it has a value larger than a variation width of ΔTd caused by a variance of the process in order to distinguish the delay failure from the variance of the process.

In the mean time, in case of detecting a delay error in the pre-stage P-channel FET 250, the first substrate voltage setting unit 122a sets the N-channel side substrate voltage VBBn provided to the DUT 100 to the first N-channel side substrate voltage VBBn1 (S500). Thus, the threshold of each of the pre-stage N-channel FET 260 and the post-stage N-channel FET 280 is set to the voltage Vth1 (L).

Then, in a similar way to the case of detecting the delay time of the pre-stage N-channel FET 260, the first delay time measuring unit 152a measures a first N-channel side delay time Tn1 when the substrate voltage of the post-stage N-channel FET 280 is set to the first substrate voltage VBBn1 (S510).

The second substrate voltage setting unit 122b sets the substrate voltage of the post-stage N-channel FET 280 to the second substrate voltage VBBn2 (S520).

In a similar way to S510, the second delay time measuring unit 152b measures the second delay time Tn2 when the substrate voltage of the post-stage N-channel FET 280 is set to the second substrate voltage VBBn2 (S530).

Then, in a similar way to the case of detecting the delay error in the pre-stage N-channel FET 260, the error detecting unit 160 detects an error in the switching speed of the circuit 220 caused by a defect of the pre-stage P-channel FET 250 based on the first and second delay times Tn1 and Tn2 (S540).

As described above, according to the test apparatus 10, it is possible to detect delay errors in the N-channel FET and the P-channel FET in the DUT 100 based on the increases of the delay times in case of changing the substrate voltages provided to the P-channel FET and the N-channel FET in the DUT 100, respectively. Thus, the test apparatus 10 can detect properly an error in the switching speed of the circuit 200.

Further, the substrate voltage setting units 122a and 122b may detect an error or errors in the pre-stage P-channel FET 250 and the pre-stage N-channel FET 260 in single test by setting the P-channel side and the N-channel side substrate voltages VBBp1 and VBBn1 at the same time and setting the P-channel side and the N-channel side substrate voltages VBBp2 and VBBn2 at the same time.

Figure 6:
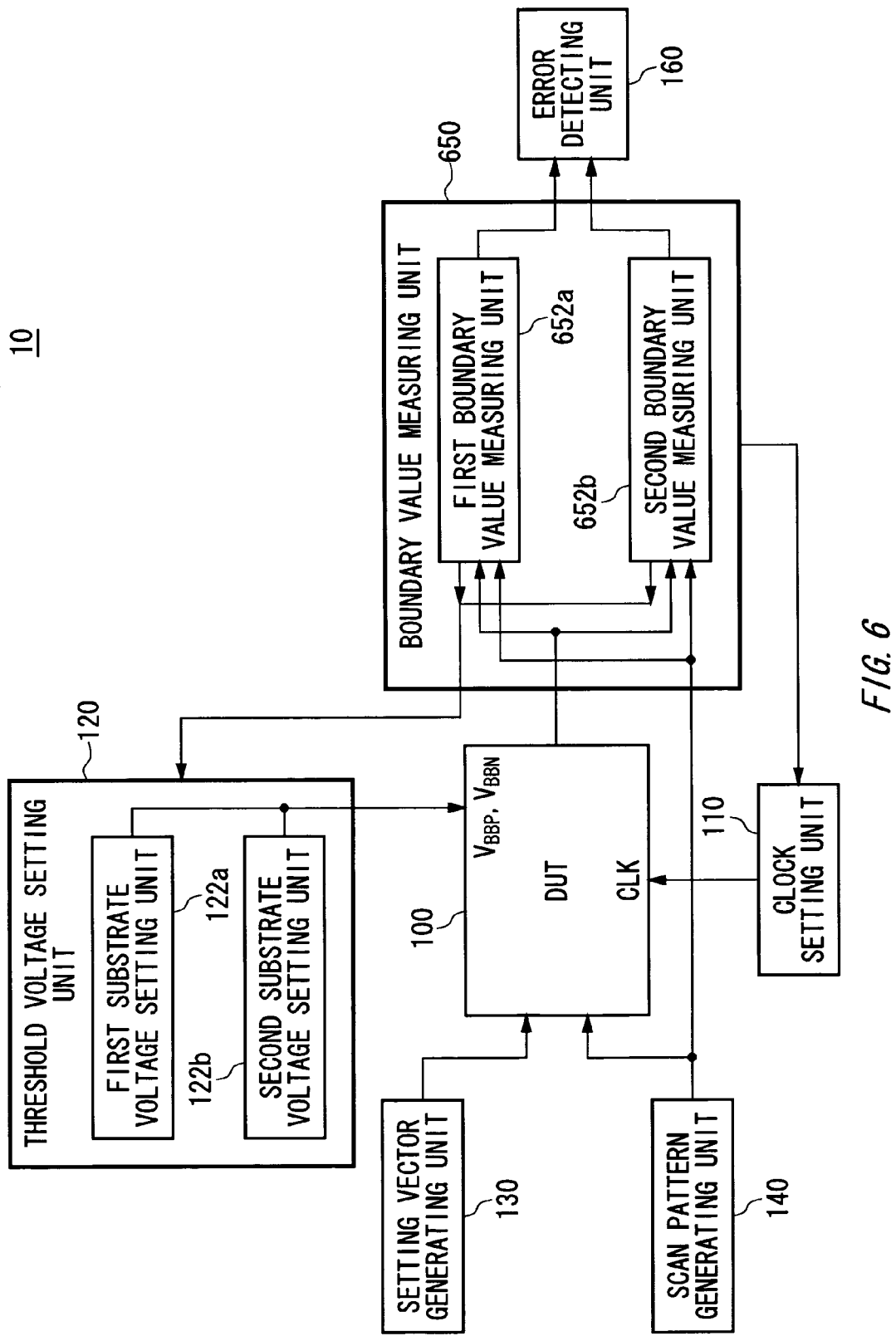
FIG. 6 shows an example of the configuration of the test apparatus 10 according to an alternative embodiment of the present invention.

FIG. 6 shows an example of the configuration of the test apparatus 10 according to an alternative embodiment of the present invention. The test apparatus 10 according to the present embodiment acquires a boundary value of the substrate voltage in case of setting a predetermined clock interval to the clock interval from the time when a clock signal is provided to the FF 200 to the time when a clock signal is provided to the FF 210 and detects an error in the switching speed of the DUT 100 based on the boundary value. Since the elements indicated by the same reference numerals as those of FIG. 1 have the same functions and configurations as those of FIG. 1, explanation on the elements with the exception of differences is omitted.

The delay time measuring unit 650 includes a first boundary value measuring unit 652a and a second boundary value measuring unit 652b. The first boundary value measuring unit 652a sets the clock interval of the DUT 100 to Tp1 using the clock setting unit 110. Then, the first boundary value measuring unit 652a changes the substrate voltage VBBp by the threshold voltage setting unit 120 and measures a boundary value VBBp1 of the substrate voltage at which the circuit 220 properly operates, when the clock interval is set to Tp1. Similarly, the first boundary value measuring unit 652a sets the clock interval of the DUT 100 to Tn1 using the clock setting unit 110. Then, the first boundary value measuring unit 652a changes the substrate voltage VBBn by the threshold voltage setting unit 120 and measures a boundary value VBBn1 of the substrate voltage at which the circuit 220 properly operates when the clock interval is set to Tn1. Here, in case of using a value T1 as the clock interval Tp1 and Tn1, the first boundary value measuring unit 652a may change the substrate voltages VBBp and VBBn by the threshold voltage setting unit 120 and measure the boundary values VBBn1 and VBBn1 of the substrate voltage when the clock interval is set to T1.

In a similar way to the first boundary value measuring unit 652a, the second boundary value measuring unit 652b sets the clock interval of the DUT 100 to Tp2 using the clock setting unit 110. Then, in a similar way to the first boundary value measuring unit 652a, the second boundary value measuring unit 652b changes the substrate voltage VBBp and/or VBBn by the threshold voltage setting unit 120 and measures a boundary value VBBp2 and/or VBBn2 of the substrate voltage at which the circuit 220 properly operates, when the clock interval is set to Tp2 and/or Tn2.

The error detecting unit 160 detects an error in the switching speed of the circuit 220 based on the first boundary value of the substrate voltage VBBp and/or VBBn when the clock interval is set to Tp1 and/or Tn1 and the second boundary value of the substrate voltage VBBp and/or VBBn when the clock interval is set to Tp2 and/or Tn2.

Figure 7:
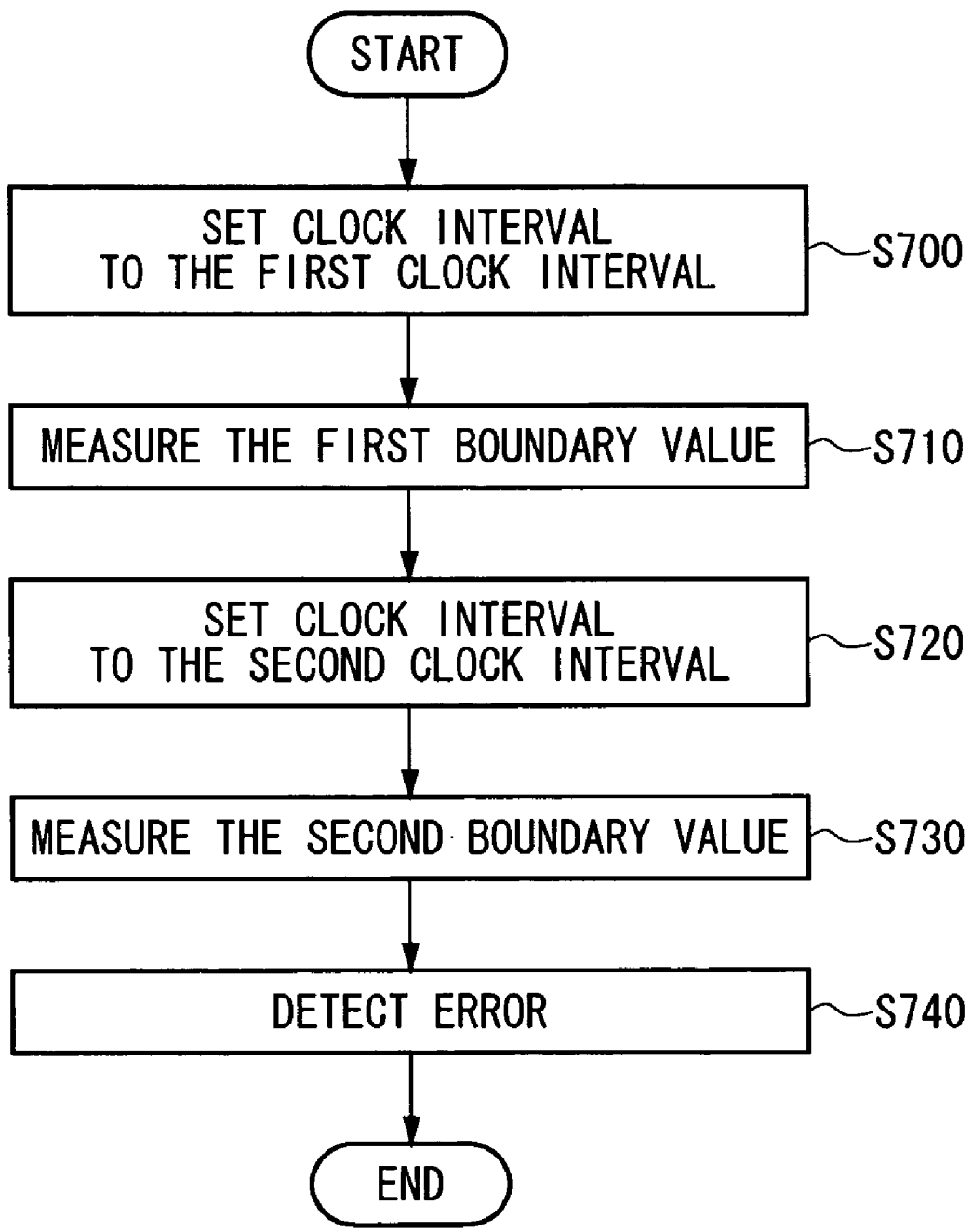
FIG. 7 shows a flow of an operation of the DUT 100 according to the alternative embodiment of the present invention.

FIG. 7 shows a flow of an operation of the DUT 100 according to the alternative embodiment of the present invention.

In case of detecting a delay error in the pre-stage N-channel FET 260, the first boundary value measuring unit 652a first instructs the clock setting unit 110 to set the clock interval of the DUT 100 to the first clock interval Tp1. In response, the clock setting unit 110 sets the clock interval of the DUT 100 to Tp1 (S700).

Then, the first boundary value measuring unit 652a changes the substrate voltage VBBp by the threshold voltage setting unit 120 while the clock interval is set to Tp1. Then, the first boundary value measuring unit 625a performs a test on a logic path including the FF 220, the circuit 220 and the FF 210 for each time when the substrate voltage VBBp is changed. By this, the first boundary value measuring unit 652a measures the first boundary value VBBp1 of the substrate voltage for the normal operation of the circuit 220 (S710).

Then, the second boundary value measuring unit 652b instructs the clock setting unit 110 to set the clock interval of the DUT 100 to the second clock interval Tp2. In response, the clock setting unit 110 sets the clock interval of the DUT 100 to Tp2 (S720).

Then, the second boundary value measuring unit 652b changes the substrate voltage VBBp by the threshold voltage setting unit 120 while the clock interval is set to Tp2. Then, the second boundary value measuring unit 625b performs a test on a logic path including the FF 220, the circuit 220 and the FF 210 for each time when the substrate voltage VBBp is changed. By this, the second boundary value measuring unit 652b measures the second boundary value VBBp2 of the substrate voltage for the normal operation of the circuit 220 (S730).

Then, the error detecting unit 160 detects an error in the switching speed of the circuit 220 caused by an error in the pre-stage N-channel FET 260 based on the first and second boundary values VBBp1 and VBBp2 (S740). In more detail, in case of testing the DUT 100 with ΔTd made constant, it is possible to detect an error in the pre-stage N-channel FET 260 when the difference ΔVBB between the first and second boundary values VBBp1 and VBBp2 is smaller than a predetermined reference value.

On the other hand, in case of detecting a delay error in the pre-stage P-channel FET 250, the first boundary value measuring unit 652a first instructs the clock setting unit 110 to set the clock interval of the DUT 100 to the first clock interval Tn1. In response, the clock setting unit 110 sets the clock interval of the DUT 100 to Tn1 (S700).

Then, as in case of detecting the delay error of the pre-stage N-channel FET 260, the first boundary value measuring unit 652a changes the substrate voltage VBBn by the threshold voltage setting unit 120 while the clock interval is set to Tn1, and performs a test. Then, the first boundary value measuring unit 652a measures the first boundary value VBBn1 of the substrate voltage for the normal operation of the circuit 220 (S710).

Then, the second boundary value measuring unit 652b instructs the clock setting unit 110 to set the clock interval of the DUT 100 to the second clock interval Tn2. In response, the clock setting unit 110 sets the clock interval of the DUT 100 to Tn2 (S720).

Then, like the case of detecting the delay error of the pre-stage N-channel FET 260, the second boundary value measuring unit 652b changes the substrate voltage VBBn by the threshold voltage setting unit 120 while the clock interval is set to Tn2, and performs a test. Then, the second boundary value measuring unit 652b measures the second boundary value VBBn2 of the substrate voltage for the normal operation of the circuit 220 (S730).

Then, the error detecting unit 160 detects an error in the switching speed of the circuit 220 caused by an error in the pre-stage P-channel FET 260 based on the first and second boundary values VBBp1 and VBBp2 (S740).

As described above, according to the test apparatus 10 of the present alternative embodiment, it is possible to detect a delay failure of the N-channel FET in the DUT 100 based on the boundary value of the substrate voltage provided to the P-channel FET in the DUT 100, and a delay failure of the P-channel FET in the DUT 100 based on the boundary value of the substrate voltage provided to the N-channel FET in the DUT 100. By this, the test apparatus 10 can detect an error in the switching speed of the circuit 220 properly.

Further, the first and second boundary value measuring units 652a and 652b may detect an error or errors in the pre-stage P-channel and N-channel FET's 250 and 260 through the same test by setting the substrate voltage setting unit 122a to the P-channel side substrate voltage VBBp1 and the N-channel side substrate voltage VBBn1 at the same time and setting the substrate voltage setting unit 122b to the P-channel side substrate voltage VBBp2 and the N-channel side substrate voltage at the same time.

Figure 8:
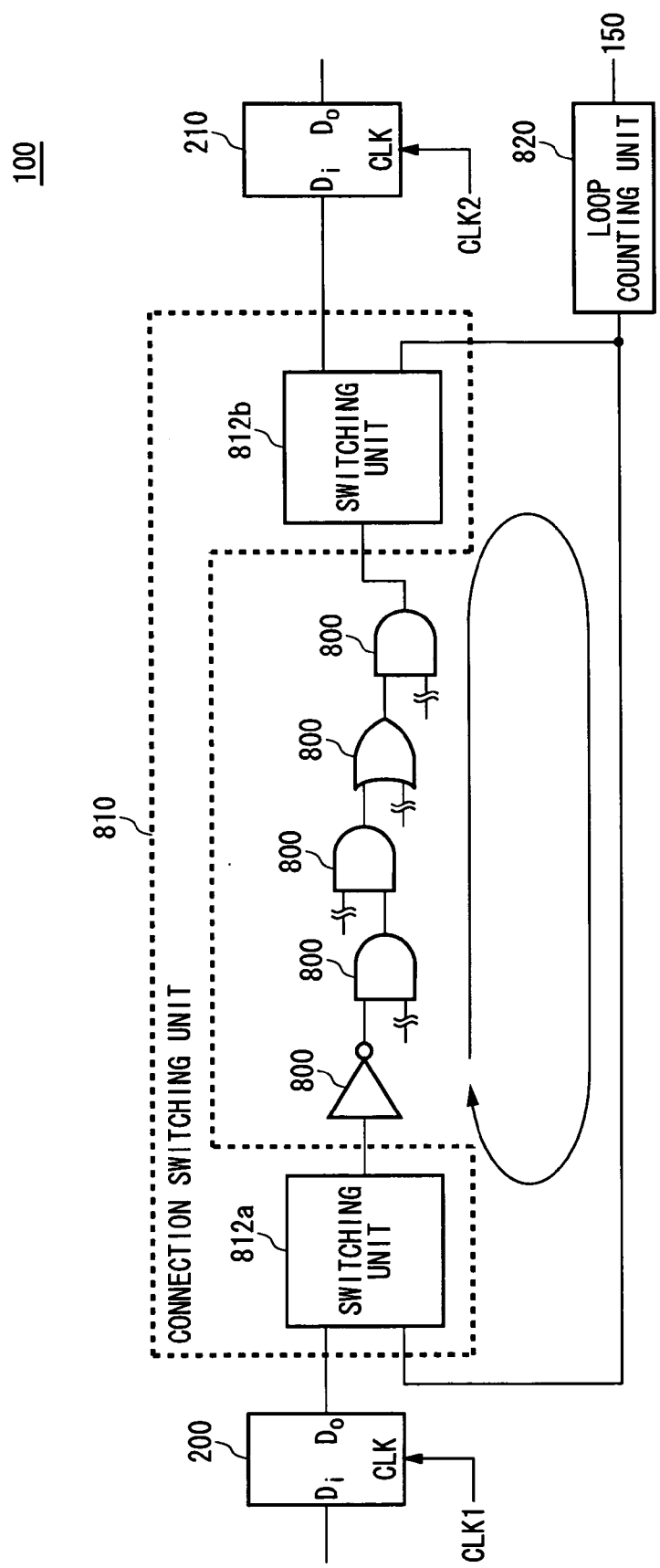
FIG. 8 shows another example of the configuration of the DUT 100 according to the embodiment of the present invention.

FIG. 8 shows another example of the configuration of the DUT 100 according to the present embodiment. According to the present embodiment, the DUT 100 includes the FF's 200 and 210, a circuit 220 to which a plurality of logic elements 800 are coupled and provided between the FF's 200 and 210, a connection switching unit 810, and a loop counting unit 820.

The connection switching unit 810 includes switching units 812a and 812b, and forms an oscillating circuit including the circuit 220 by connecting the circuit 220 in a loop shape based on the instruction of the scan pattern generating unit 140 in case of the test apparatus 10 measuring the delay time of the circuit 220. The loop counting unit 820 counts the number of repeated transmission of a signal input to the circuit 220 in the looped manner.

For measuring the delay time, the setting vector generating unit 130 generates a setting vector for testing the circuit 220 and provides the signal terminal of the DUT 100 with the setting vector. Then, the scan pattern generating unit 140 generates the scan pattern used for a test for a delay failure of the circuit 220, and provides the scan terminal of the DUT 100 with the scan pattern. When this scan pattern is input, the circuit 220 is coupled in looped manner by the connection switching unit 810 and a counting value of the loop counting unit 820 is initialized. Therefore, operation of the circuit 220 in the DUT 100 starts. As a result, the signal, which makes the circuit 220 operate, is input to the circuit 220, and the circuit 220 transmits the signal in the looped manner and repeats the switching operation. The loop counting unit 820 measures the number of circulation of the signal in the circuit 220 by counting the number of the change of the output of the circuit 220.

Then, the first delay time measuring unit 152a stops counting of the loop counting unit 820 after a predetermined time from the start of the operation of the circuit 220. Therefore, the first delay time measuring unit 152a acquires the delay time Tp1 of the circuit 220 by dividing the predetermined time by the counting value of the loop counting unit 820. Further, it is possible to acquire the delay time(s) Tn1, Tp2 and/or Tn2 by the same or similar method.

According to the present embodiment, it is possible to acquire a delay time accurately without changing the clock interval for the logic path provided with a loop function.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing switching speed of a circuit, which comprises a pre-stage logic element outputting a first or second level voltage and a post-stage logic element to which the output signal of the pre-stage logic element is input, comprising:
   a threshold voltage setting unit for setting a threshold voltage of a post-stage field effect transistor (FET) to be different from that in a normal operation by setting a substrate voltage of the post-stage FET to have a value different from that in the normal operation of the circuit;
   a delay time measuring unit for measuring a delay time of the circuit to which the threshold voltage different from that in the normal operation is set; and
   an error detecting unit for detecting an error in switching speed of the circuit based on the delay time,
   wherein the post-stage logic element comprises the post-stage FET, a gate terminal of which the output signal is input to, for outputting a different level of voltage according to the case that the output signal voltage is higher or lower than a predetermined threshold voltage.

2. A test apparatus as claimed in claim 1,
   wherein said threshold voltage setting unit comprises:
      a first substrate voltage setting unit for setting the threshold voltage to the post-stage FET by setting the substrate voltage to a first substrate voltage; and
      a second substrate voltage setting unit for setting the threshold voltage to the post-stage FET by setting the substrate voltage to a second substrate voltage, said delay time measuring unit comprises:
      a first delay time measuring unit for measuring a first delay time of the circuit when the substrate voltage is set to the first substrate voltage; and
      a second delay time measuring unit for measuring a second delay time of the circuit when the substrate voltage is set to the second substrate voltage, and
      said error detecting unit detects the error in switching speed of the circuit in case of the difference between the first and the second delay times being larger than a predetermined reference value.

3. A test apparatus as claimed in claim 2, wherein said first substrate voltage setting unit sets the substrate voltage to the first substrate voltage used in the normal operation of the circuit.

4. A test apparatus as claimed in claim 2, wherein the pre-stage logic element comprises:
   a pre-stage P-channel FET comprising a source terminal coupled to a voltage source with respect to the output signal and a drain terminal coupled to the side of the output signal with respect to the source terminal; and
   a pre-stage N-channel FET comprising a source terminal coupled to a ground with respect to the output signal and a drain terminal coupled to the side of the output signal with respect to the source terminal, the post-stage logic element comprises:
   a post-stage P-channel FET comprising a source terminal coupled to a voltage source with respect to the output of the post-stage logic element and a drain terminal coupled to the output side with respect to the source terminal; and
   a pre-stage N-channel FET comprising a source terminal coupled to a ground with respect to the output and a drain terminal coupled to the output side with respect to the source terminal,
   said first substrate voltage setting unit sets the substrate voltage of said post-stage N-channel FET to the first substrate voltage,
   said first delay time measuring unit measures the first delay time when the substrate voltage of said post-stage N-channel FET is set to the first substrate voltage,
   said second substrate voltage setting unit sets the substrate voltage of said post-stage N-channel FET to the second substrate voltage,
   said second delay time measuring unit measures the second delay time when the substrate voltage is set to the second substrate voltage, and
   said error detecting unit detects an error in said pre-stage P-channel FET in case of the difference between the first and second delay times being larger than the reference value.

5. A test apparatus as claimed in claim 2, wherein the pre-stage logic element comprises:
   a pre-stage P-channel FET comprising a source terminal coupled to a voltage source with respect to the output signal and a drain terminal coupled to the side of the output signal with respect to the source terminal; and
   a pre-stage N-channel FET comprising a source terminal coupled to a ground with respect to the output signal and a drain terminal coupled to the side of the output signal with respect to the source terminal, the post-stage logic element comprises:
   a post-stage P-channel FET comprising a source terminal coupled to a voltage source with respect to the output of the post-stage logic element and a drain terminal coupled to the output side with respect to the source terminal; and
   a pre-stage N-channel FET comprising a source terminal coupled to a ground with respect to the output and a drain terminal coupled to the output side with respect to the source terminal,
   said first substrate voltage setting unit sets the substrate voltage of said post-stage P-channel FET to the first substrate voltage,
   said first delay time measuring unit measures the first delay time when the substrate voltage of said post-stage P-channel FET is set to the first substrate voltage,
   said second substrate voltage setting unit sets the substrate voltage of said post-stage P-channel FET to the second substrate voltage,
   said second delay time measuring unit measures the second delay time when the substrate voltage is set to the second substrate voltage, and
   said error detecting unit detects an error in said pre-stage N-channel FET in case of the difference between the first and second delay times being larger than the reference value.

6. A test method for testing switching speed of a circuit, which comprises a pre-stage logic element outputting a first or second level voltage and a post-stage logic element to which the output signal of the pre-stage logic element is input, comprising:
   a threshold voltage setting step of setting a threshold voltage of a post-stage field effect transistor (FET) to be different from that in a normal operation by setting a substrate voltage of the post-stage FET to have a value different from that in the normal operation of the circuit;

a delay time measuring step of measuring a delay time of the circuit to which the threshold voltage different from that in the normal operation is set; and an error detecting step of detecting an error in switching speed of the circuit based on the delay time, wherein the post-stage logic element comprises the post-stage FET, a gate terminal of which the output signal is input to, for outputting a different level of voltage according to the case that the output signal voltage is higher or lower than a predetermined threshold voltage.

* * * * *